(12) United States Patent
Caprara et al.

(10) Patent No.: US 6,198,756 B1
(45) Date of Patent: Mar. 6, 2001

(54) CW FAR-UV LASER SYSTEM WITH TWO ACTIVE RESONATORS

(75) Inventors: Andrea Caprara, Menlo Park; Luis A. Spinelli, Sunnyvale, both of CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 09/292,540

(22) Filed: Apr. 15, 1999

(51) Int. Cl.$^7$ ....................................... H01S 3/10

(52) U.S. Cl. ................. 372/22; 372/21; 372/92; 372/94

(58) Field of Search ................ 372/22, 92, 69, 372/70, 21, 94; 359/326

(56) References Cited

U.S. PATENT DOCUMENTS

| | | | |
|---|---|---|---|
| 5,050,179 | 9/1991 | Mooradian | 372/44 |
| 5,131,002 | 7/1992 | Mooradian | 372/50 |
| 5,289,485 | 2/1994 | Mooradian | 372/45 |
| 5,461,637 | 10/1995 | Mooradian et al. | 372/92 |
| 5,627,853 | 5/1997 | Mooradian et al. | 372/92 |
| 5,651,019 | 7/1997 | Goldberg et al. | 372/68 |
| 5,912,910 * | 6/1999 | Sanders et al. | 372/22 |
| 5,991,318 | 11/1999 | Caprara et al. | 372/22 |

FOREIGN PATENT DOCUMENTS

| | | | |
|---|---|---|---|
| 0 608 866 | 1/1994 | (EP) | H01S/3/108 |

OTHER PUBLICATIONS

W. P. Risk et al., "Diode laser pumped blue–light source based on intracavity sum frequency generation," *Applied Physics Letters*, vol. 54, No. 9, Feb. 27, 1989, pp. 789–791.

P.N. Kean et al., "Generation of 20 mW of blue laser radiation from a diode–pumped sum–frequency laser," *Appl. Phys. Lett.*, vol. 63, No. 3, Jul. 1993, pp. 302–304.

G. C. Bhar et al., "Widely tunable deep ultraviolet generation in CLBO," *Optics Communications*, vol. 176, Mar. 15, 2000, pp. 199–205.

K. Koch et al., "Raman Oscillation with Intracavity Sum–Frequency Generation," *IEEE Journal of Quantum Electronics*, vol. 35, No. 1, Jan. 1999, pp. 72–78.

Y. K. Yap et al., "High–power fourth—and fifth–harmonic generation of a Nd:YAG laser by means of a $CsLiB_6O_{10}$," *Optics Letters*, vol. 21, No. 17, Sep. 1, 1996, pp. 1348–1350.

"Notification of Transmittal of the International Search Report or the Declaration," in Int'l Application No. PCT/US00/04299, mailed Jul. 14, 2000, 8 pages in length.

J.V. Sandusky & S.R.J. Brueck, "A CW External–Cavity Surface–Emitting Laser," *IEEE Photonics Technology Letters*, vol. 8, No. 3, Mar. 1996, pp. 313–315.

M. Kuznetsov, F. Hakimi, R. Sprague & A. Mooradian, "High–Power (>0.5–W CW) Diode–Pumped Vertical–External–Cavity Surface–Emitting Semiconductor Lasers with Circular $TEM_{00}$ Beams," *IEEE Photonics Technology Letters*, vol. 9, No. 8, Aug. 1997, pp. 1063–1065.

(List continued on next page.)

Primary Examiner—Leon Scott, Jr.
(74) Attorney, Agent, or Firm—Limbach & Limbach L.L.P.

(57) ABSTRACT

A laser system includes two separate active laser-resonators. A first of the laser-resonators delivers laser-radiation at a first wavelength, and the second generates fundamental laser-radiation at second wavelength. The second resonator includes an optically-nonlinear crystal. The radiation delivered by the first laser-resonator is mixed in the optically-nonlinear crystal with the fundamental radiation circulating in the second resonator thereby generating radiation having the sum frequency of the first and second wavelengths. In one example, an OPS-laser-resonator having a fundamental wavelength of 976 nm includes a CLBO crystal. 244 nm radiation from an intracavity-frequency-doubled 488 nm argon-ion laser is mixed in the CLBO with the 976 nm radiation to provide 195 nm radiation.

23 Claims, 8 Drawing Sheets

OTHER PUBLICATIONS

A. Rosiewicz, P. Crosby & J–M. Pelaprat, "Optical pumping improves VCSEL performance," *Laser Focus World*, Jun. 1997, pp. 133–136.

W.J. Alford, T.D. Raymond, M.H. Crawford and A.A. Allerman, "Intracavity frequency doubling of an optically–pumped, external–cavity surface–emitting semiconductor laser," Advanced Solid State Laser Conference, Sandia National Laboratories, Sand–98–2108C, CONF–990105, Dec. 31, 1998, 5 pages in length.

* cited by examiner

CW FAR-UV LASER SYSTEM WITH TWO ACTIVE RESONATORS

TECHNICAL FIELD OF THE INVENTION

The present invention relates in general to ultraviolet (UV) lasers. It relates, in particular, to a laser in which radiation at a wavelength between about 200 and 280 nanometers (nm), generated by a first active laser-resonator, is mixed, in an optically-nonlinear crystal located in a second active laser-resonator, with radiation generated by the second laser resonator and having a wavelength between about 900 and 1080 nm, thereby generating radiation having a third wavelength corresponding to the sum-frequency of the first and second wavelengths and having a wavelength between about 175 and 215 nm.

DISCUSSION OF BACKGROUND ART

Optical systems are used in optical lithography for patterning or "writing" on photoresist for lithographic masking operations. The resolution of these optical systems is inversely related to the wavelength used for the patterning or writing. In so-called direct-writing systems, where photoresist coated wafers are directly patterned by an optically-steered, focussed, beam of radiation rather than being exposed the, the quality of the beam is as important as the wavelength of the beam for obtaining highest possible resolution, and, accordingly smallest possible feature size. Smaller features, of course, lead to higher component packing densities. One particularly useful light source for direct writing operations is an intracavity frequency-doubled argon ion-laser. having an output wavelength of 244 nm. Such a laser is used in a direct writing system manufactured by Etec, Inc., of Hayward, Calif.

Because of a continuing demand for ever smaller and faster semiconductor devices, there is a similar need for a laser system having a shorter wavelength than the 244 nm of existing direct-writing systems. Such a laser system, of course, should have a beam-quality comparable to existing 244 nm laser systems and provide sufficient power such that exposure times are not unacceptably protracted.

SUMMARY OF THE INVENTION

In one aspect of the present invention, a laser system comprises first and second active laser-resonators. The first laser-resonator delivers laser-radiation at a first wavelength, and the second laser-resonator is arranged to generate laser-radiation therein at a second wavelength. The second laser-resonator includes an optically-nonlinear crystal. The first and second laser-resonators and the optically-nonlinear crystal are cooperatively arranged such that first-wavelength radiation delivered by the first laser-resonator is mixed in the optically-nonlinear crystal with the second-wavelength radiation generated in the second laser-resonator, thereby generating radiation having a third-wavelength corresponding to the sum frequency of the first and second wavelengths.

In another aspect of the present invention, radiation having a wavelength between about 200 and 280 nanometers (nm), generated by a first active laser-resonator, is mixed, in an optically-nonlinear crystal located in a second active laser-resonator, with radiation generated by a second laser resonator and having wavelength between about 900 and 1080 nm, thereby generating radiation having a third wavelength corresponding to the sum-frequency of the first and second wavelengths and having a wavelength between about 175 and 215 nm.

In one embodiment of a laser system in accordance with the present invention, 1 Watt (W) of 244 nm radiation is delivered by a prior-art. intracavity frequency-doubled argon-ion laser. Fundamental radiation having a wavelength of about 976 nm is generated in an external-cavity surface-emitting semiconductor laser-resonator (OPS laser-resonator). The 244 nm radiation is mixed in a cesium lithium borate (CLBO) optically-nonlinear crystal with about 500 Watts (W) of 976 nm radiation circulating in the OPS laser-resonator to provide about 100 milliwatts (mW) of radiation having a wavelength of about 195 nm.

Dispersion characteristics of CLBO allow that the 244 nm radiation can be directed into the CLBO optically-nonlinear crystal without passing through any optical components of the second resonator, thereby avoiding potential absorption losses in those components. Similarly, the 195 nm radiation generated by the sum-frequency mixing, and residual 244 nm radiation, leave the second resonator without passing through any optical components thereof.

In another embodiment of the inventive laser system, the optically-nonlinear crystal in the active, second laser-resonator is commonly located in a passive, travelling-wave ring-resonator ring-resonator arranged to recirculate and build up the 244 nm radiation passing through the CLBO crystal, thereby increasing the output power of 195 nm radiation to about 800 mW.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the invention.

DETAILED DESCRIPTION OF THE INVENTION

Figure 1:
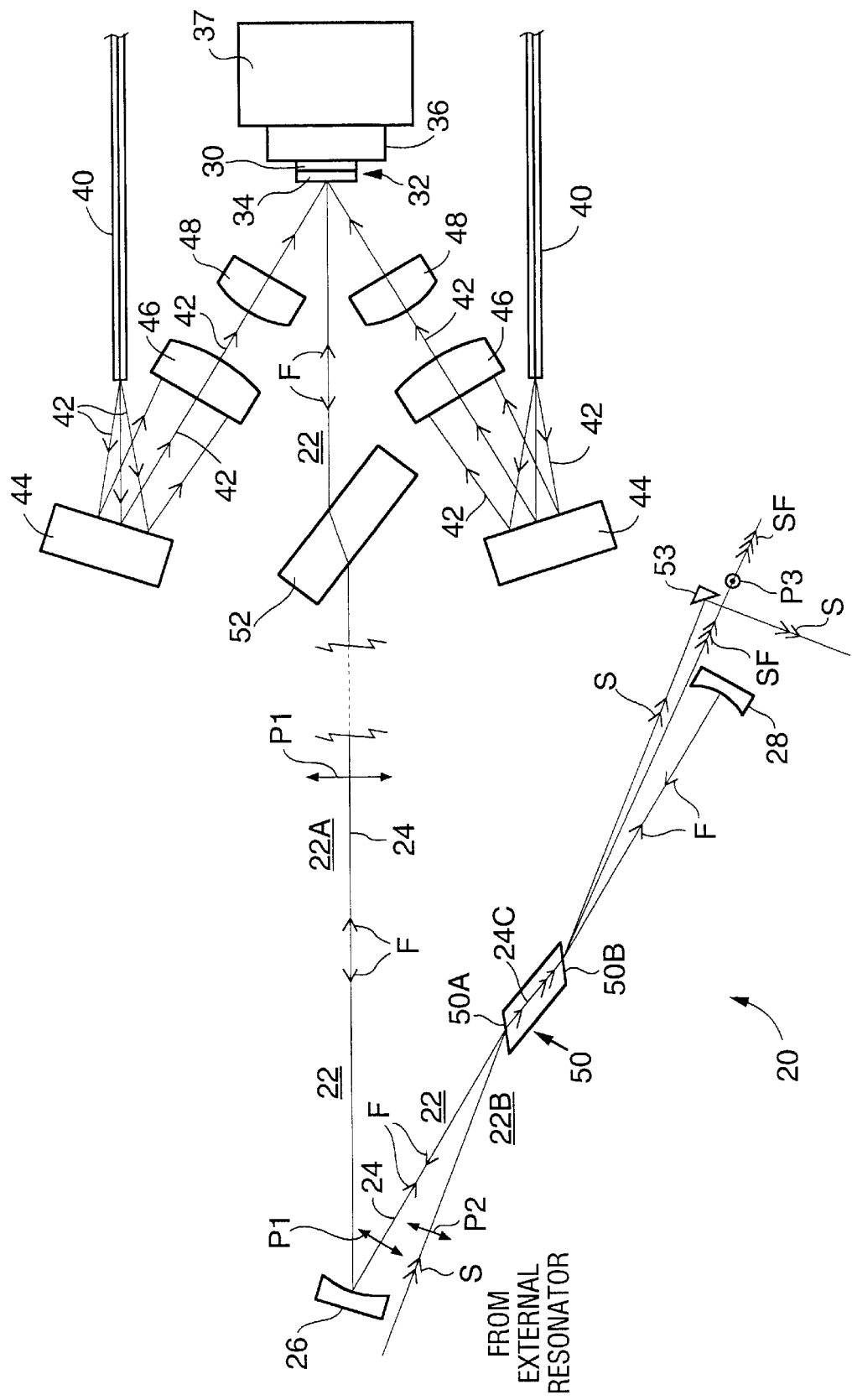
FIG. 1 schematically illustrates a preferred embodiment of a UV-laser system in accordance with the present invention having a first laser-resonator including an OPS-structure and an optically-nonlinear crystal arranged for intracavity frequency-mixing a fundamental-wavelength of the OPS-structure with UV-radiation injected into the first laser-resonator from a second laser-resonator.

Turning now to the drawings, wherein like components are designated by like reference numerals. FIG. 1 schematically illustrates one preferred embodiment of laser-system 20 in accordance with the present invention. This system, as illustrated in FIG. 1, is configured for sum-frequency mixing 244 nm radiation with 976 nm radiation to provide 195 nm radiation.

Laser 20 includes a resonator 22 having a longitudinal axis 24 thereof folded by a fold-mirror 26. Resonator 22 is terminated at one end thereof by a mirror 28, and at the other end thereof by a mirror portion (mirror-structure) 30 of an optically-pumped surface-emitting semiconductor laser structure (OPS-structure) 32. A gain portion (gain-structure) 34 of OPS-structure 32 is thus located in the resonator in contact with a resonator mirror, i.e., mirror-structure 30. Resonator 22 may be considered as being folded into two arms 22A and 22B by fold mirror 26. In this preferred embodiment, arm 22A is about twice as long as arm 22B and is shown foreshortened in FIG. 1 for convenience of illustration.

Gain-structure 34 of OPS-structure 32 is an epitaxially-grown monolithic semiconductor multilayer structure including a plurality of active layers (not shown in FIG. 1) spaced apart by pump-light-absorbing separator-layers (also not shown in FIG. 1). It should be noted here that the terminology "spaced apart by pump-light-absorbing separator layers" in the context of this description and the appended claims does not preclude there being other layers between the QW layers. Depending on the composition of the QW layers, one or more other layers may be included for strain-management, carrier-confinement and the like. Any such arrangement is applicable in the context of the present invention. In this preferred embodiment, QW layers have a composition selected to provide fundamental radiation at a wavelength of about 976 nm.

Continuing now with reference to FIG. 1, OPS-structure 32 is bonded in thermal contact with a heat-sink 36. Heat-sink 36 is preferably an actively-cooled heat-sink such as a microchannel-cooler. OPS-structure 32 is optically pumped, preferably, by pump-light delivered from one or more diode-laser arrays (not shown). In FIG. 1, pump-light is delivered from two diode-laser arrays via two optical fibers (or fiber bundles) 40. Pump-light 42 diverges as it exits a fiber 40. In each case, the diverging pump-light is directed by a mirror 44, through focusing lenses 46 and 48, to be focused (only an axial ray shown) on gain-structure 34 of OPS-structure 32. It should be noted, that while two pump-light-delivery fibers 40 and associated focussing optics are illustrated in FIG. 1, this should not be considered as limiting the present invention. Only one, or more than two pump-light-delivery fibers and associated focusing-optics may be used, and even different pump-light sources with or without fiber delivery may be used, without departing from the spirit and scope of the present invention. Further, it should be noted that optical fibers and fiber bundles are just one preferred means of transporting pump-light from a source thereof. Other forms of what may be generally termed "a lightguide", for example, solid or hollow light-waveguides maybe used without departing from the spirit and scope of the present invention.

Mirrors 26 and 28, and mirror-structure 30 of OPS-structure 32, each have maximum reflectivity at a fundamental (emission) wavelength characteristic of the composition of (active layers of) gain-structure 34 of OPS-structure 32, here 976 nm. Details of one preferred OPS structure for providing this fundamental wavelength are discussed further hereinbelow. Energizing gain-structure 34 of OPS-structure 32 causes laser-radiation having the fundamental-wavelength (fundamental-radiation) to circulate in resonator 22. This fundamental-radiation is indicated in FIG. 1 by single arrows F.

Included in resonator 22, in folded portion 22B thereof, proximate, but spaced apart from mirror 28, is an optically-nonlinear crystal 50 arranged for sum frequency mixing fundamental radiation F with UV-radiation (designated by double arrows S) injected into optically-nonlinear crystal 50 from an external active laser-resonator (not shown in FIG. 1). Mixing UV-radiation S with fundamental radiation F generates, by UV-radiation (designated by triple arrows SF) having a shorter wavelength than UV radiation S, i.e., having the sum-frequency of radiations F and S1.

A preferred material for optically-nonlinear crystal 50 is cesium lithium borate (CLBO). CLBO has advantageous properties for a laser system in accordance with the present invention, which, inter alia, allow that the crystal can be cut and configured such that (as shown in FIG. 1), radiation S can enter entrance-face 50A of optically-nonlinear crystal 50 at an angle of about 50 to fundamental radiation F (axis 24) and traverse the crystal about along a common path 24C. This is due to the difference in refractive index of the CLBO for the S and F wavelengths. On leaving exit face 50B of optically-nonlinear crystal 50, residual radiation S diverges at the same angle from axis 24, again due to the refractive index difference. Radiation SF diverges from radiation S by an angle of about 1°, due to a refractive index difference of the CLBO for the SF and the S radiations. This divergence allows radiation S to enter and leave resonator 22, and radiation SF to leave resonator 22, without passing through any optical components of resonator 22. This simplifies the design and manufacture of coatings for mirrors 26 and 28, as well as avoiding power loss which could be experienced in radiations S and SF had they to traverse optical coatings designed to efficiently reflect fundamental radiation F. In this arrangement, the divergence of radiations S and SF is sufficient that a reflective stop 53, or the like, may be deployed outside of resonator 22 to separate the S and SF radiations. Further details of an appropriately configured CLBO crystal are presented further hereinbelow.

While the arrangement of laser system 20 of FIG. 1 is a preferred arrangement for introducing radiation S into optically-nonlinear crystal 50, those skilled in the art to which the present invention pertains will recognize that other arrangements wherein radiation S traverses one or more mirrors of the fundamental resonator may be devised without departing from the spirit and scope of the present invention. Similarly while CLBO is considered to be particularly advantageous in a laser system in accordance with the present invention the use of any other optically nonlinear crystal, for example, beta barium borate (BBO) is not precluded. However, some reduction in performance is to be expected.

The folded-resonator arrangement of resonator 22 is designed, inter alia, to allow formation of a resonating beam in resonator 22 having optimum characteristics at OPS-structure 32 for maximum fundamental power generation in a single axial-mode, while having optimal characteristics at optically-nonlinear crystal 50 for optimum sum-frequency mixing. In one arrangement, the pump-light spot-size at OPS-structure 32 preferably has a gaussian shape, preferably with a $1/e^2$ radius of about 220 micrometers ($\mu$m). In order to maximize overlap and obtain optimum power-extraction in fundamental transverse mode, the resonating fundamental-radiation at OPS-structure 32 preferably has a similar size of 220 $\mu$m ($1/e^2$ radius). A preferred spot-size of fundamental-radiation in optically-nonlinear crystal 50 is preferably of the order of 50 $\mu$m ($1/e^2$ radius) for optimum sum-frequency mixing.

In an intracavity sum-frequency generating laser-system in accordance with the present invention, it is preferable to include a wavelength-selective element, such as a birefringent filter or an etalon in resonator 22 for forcing the resonator to oscillate precisely at the fundamental wavelength. In laser 20, such a wavelength-selective element is depicted in the form of a birefringent filter 52 arranged at Brewster's angle (here 57.1°) to axis 24 of resonator 20. It is emphasized here that the purpose of this wavelength-selective element is not axial-mode selection, as this is accomplished by a combination of the unique properties of OPS-structure 32 combined with its location in resonator 22. Rather, birefringent filter 52 is used to effectively spectrally narrow the gain-bandwidth of gain-structure 34 of OPS-structure 32 to a bandwidth narrower than a spectral acceptance region over which the optically-nonlinear crystal 50 is effective. This prevents laser 20 from oscillating at wavelengths where the optically-nonlinear crystal is ineffective.

In one example of a laser 20 in accordance with the arrangement of FIG. 1, OPS-structure 32 (see FIG. 2) has a gain-structure 34 comprising fifteen QW or active-layers of an $In_{0.18}Ga_{0.82}As$ composition, having a thickness of about 75.0 Angstrom Units (Å) providing a nominal fundamental (emission) wavelength of 976 nm. Between the QW layers are pump-light-absorbing (separator) layers of a $GaAs_{0.978}P_{0.022}$ composition having a thickness of 1217 Å. Between the QW layers and the separator layers is a strain-relieving layer of GaAs having a thickness of about 50 Å. Mirror-structure 30 comprises 27 pairs or periods of alternating layers of GaAs having a refractive index of about 3.51 and $AlAs_{0.96}P_{0.04}$ having a refractive index of about 2.94 and an optical thickness of one-quarter wavelength at the fundamental-wavelength. Gain-structure 34 also includes a carrier-confinement layer of $Ga_{0.51}In_{0.49}P$, having a thickness of 1588 Å, between the last separator layer and mirror-structure 30. At an opposite extremity of gain-structure 34 there is also a carrier-confinement layer of $Ga_{0.51}In_{0.49}P$ having a thickness of 1588 Å.

OPS-structure 32 is epitaxially grown on an n-type GaAs wafer (substrate), gain-structure 34 being grown first, beginning with the carrier confinement layer. Mirror-structure 30 is epitaxially-grown on the gain-structure. After the OPS-structure is grown, the wafer is etched away. The first-grown confinement layer serves as an etch-stop layer when the substrate is removed by etching. The wafer, and structures grown thereon, is diced into several OPS-structures 32 in the form of square "chips" about 2.0 mm by 2.0 mm.

An OPS-structure (chip) is first bonded to a microchannel-cooler (cooler 36). One preferred microchannel-cooler is a Model SA-2, available from Saddleback Aerospace Corporation of Los Alamitos, Calif. Before bonding the OPS-structure to the microchannel-cooler, a relatively thin (about 0.3 mm thick) synthetic diamond layer, preferably a single crystal diamond layer, is bonded to the microchannel-cooler. One preferred bonding method in accordance with the present invention is to provide metalization on the diamond comprising a titanium layer overcoated by an (outermost) platinum layer. Bonding is then performed using indium solder.

After the OPS-structure is bonded to the diamond-layer/microchannel-cooler, the GaAs substrate is removed by etching. Preferably, an antireflection coating is deposited on thus-exposed gain-structure 34 to improve entry of pump-light into the gain-structure.

Regarding optical pumping of OPS-structure 32, each fiber 40 delivers 795 nm radiation from diode array package, for example, a FAP-30C-800-B diode-laser-array package available from Coherent Semiconductor Group of Santa Clara, Calif. Mirrors 44 are dielectric-coated mirrors having greater than 99.9% reflectivity at 795 nm and 28° angle of incidence. Lenses 46 are cemented doublets having a focal length of 40.0 mm and a diameter of 18.0 mm. Lenses 48 are cemented doublets having a focal length of 21.0 mm and a diameter of 14 mm. These lenses are available from Melles Griot of Irvine, Calif. The pump-light is focused by the mirrors and lenses into an area of OPS-structure. A total of 34 W of pump-light in the pumped area has a substantially Gaussian intensity profile with a radius of about 260 $\mu$m at the 1/e2 points. The exemplified diode-laser-array packages providing the pump-light require about 50.0 W each of electrical-power input generate 20.0 W of pump radiation coupled into transport fibers 40.

Birefringent filter 52 is quartz plate having a thickness of 3.08 mm and oriented as depicted in FIG. 1 at 57.1 degrees to axis 24, with the quartz optical axis in the plane of the plate. Such a filter is available as Part No. BF254-6T from VLOC Company of Port Richey, Fla. This orientation of birefringent filter 52 provides that fundamental radiation F is polarized parallel to the plane of FIG. 1 as illustrated by arrow P1.

Birefringent filter 52 has narrow transmission-peaks separated by about 35 nm, each with a full width at half maximum transmission (FWHM) of about 3 nm. Maximum selectivity is achieved by keeping the quartz optic-axis at an angle of about 45 degrees from an axis defined by the intersection of the vertical plane with the plane of the plate. The wavelength of the transmission peaks can be shifted by rotating the plate slightly around an axis normal to its faces, thus achieving tuning of the filter. The computed tuning rate, confirmed experimentally, is about 5.6 nm per degree of rotation.

Figure 3:
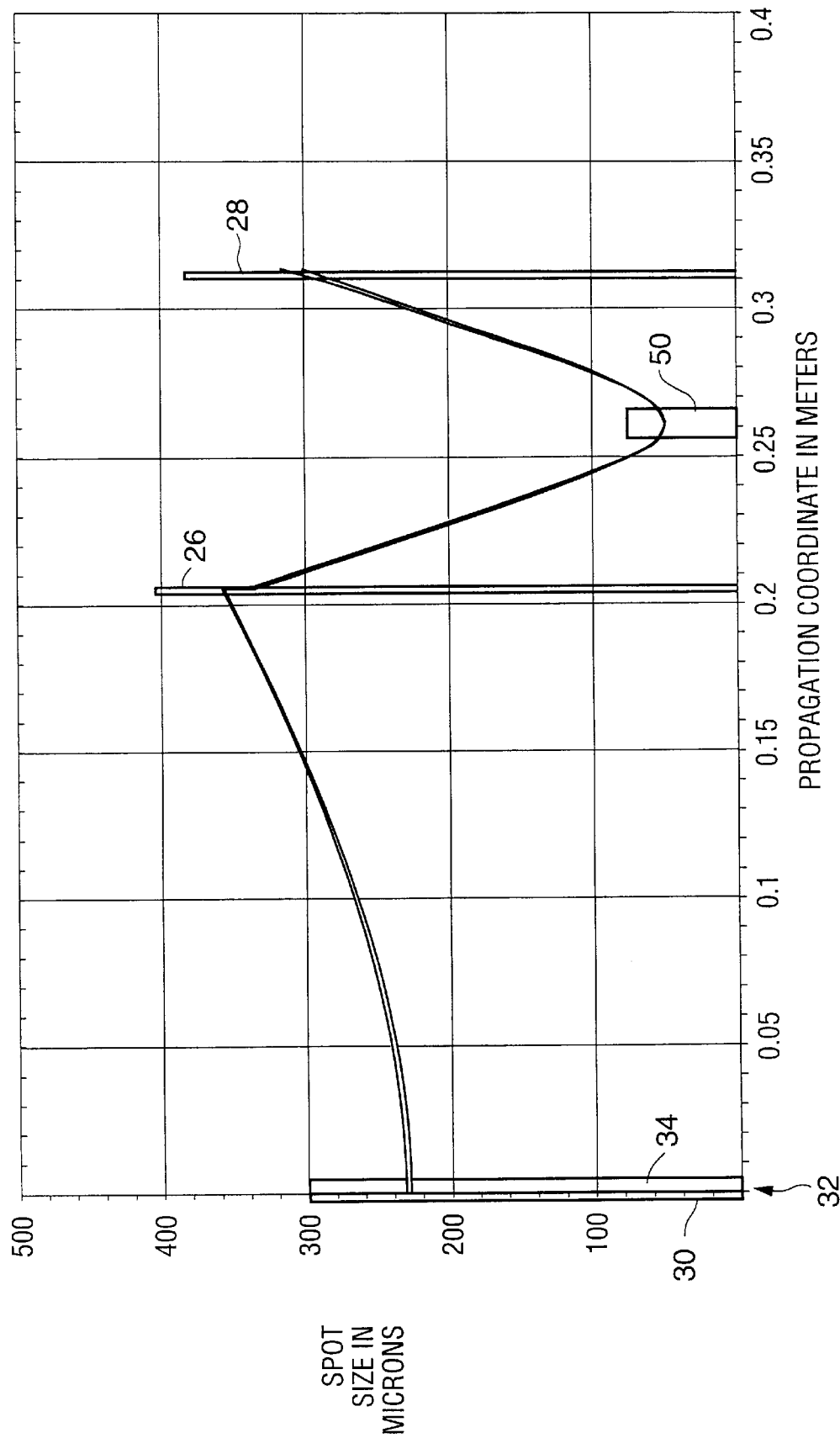
FIG. 3 is a graphical representation of the mode-size of fundamental radiation as function of axial position in one preferred embodiment of the resonator of FIG. 1.

FIG. 3 graphically illustrates spot size (spot radius or ray height) as a function of the axial position in the exemplary resonator wherein mirrors 26 and 28 are concave mirrors having a radii of curvature of 100 mm and 50 mm respectively. Mirrors 26 and 30 are axially separated by a distance of 202 mm. Mirrors 26 and 28 are axially separated by a distance of about 100 mm. Accordingly, resonator 22 has a total axial length of 302 mm, i.e., about 0.3 meters (m). It can be seen that the effect of concave mirrors 26 and 28 is to focus the beam to a radius of about 50 micrometers ($\mu$m) in optically-nonlinear crystal 50.

Figure 4A:
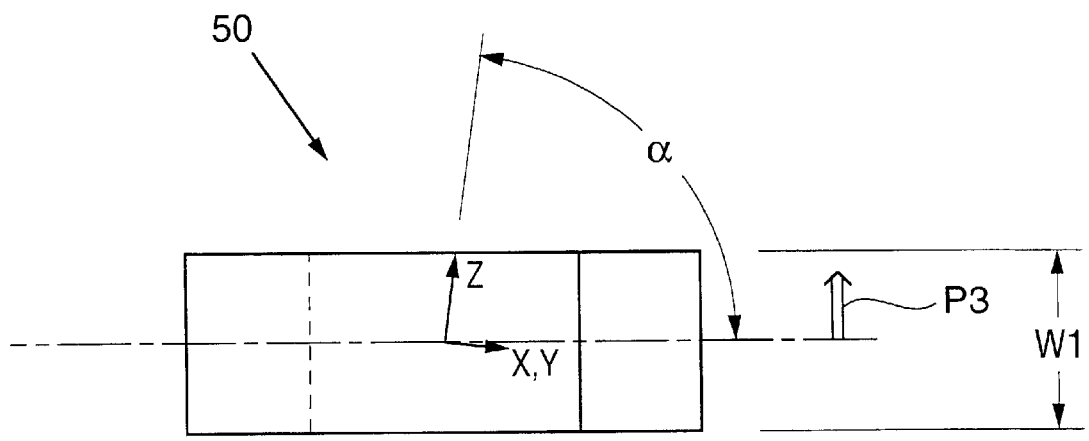
FIGS. 4A–B schematically illustrates details of a CLBO crystal arranged for use as the optically-nonlinear crystal of FIG. 1.
Figure 4B:
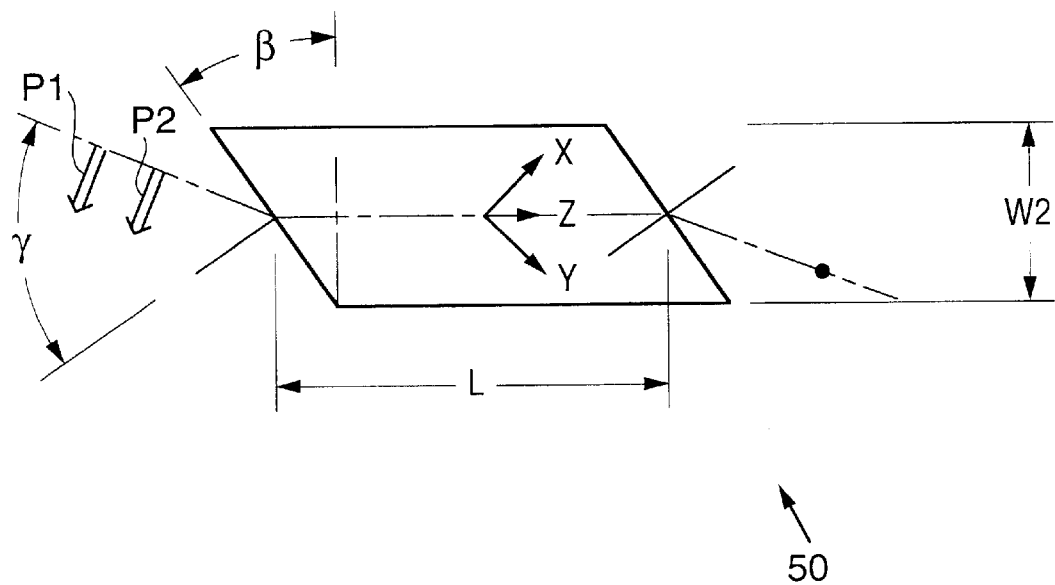

Referring now to FIGS. 4A and 4B, optically-nonlinear crystal 50 in this example, is a CLBO crystal having a length L of 10.0 mm and a cross-section (W1 and W2) of 3.5 mm×3.5 mm. The crystal is cut for type-1 mixing 976 nm radiation. Propagation of the fundamental beam is at 6.7° to the crystallographic X-Y plane. The crystallographic z-axis is at an angle $\alpha$ of 83.3° to the propagation direction. The fundamental-radiation F and injected ultraviolet radiation S are polarized parallel to the X-Y plane as illustrated by arrows P1 and P2. Sum-frequency radiation SF is polarized perpendicular to the X-Y plane, as illustrated by arrow P3.

Faces 50A and 50B of optically-nonlinear-crystal 50 are polished at an angle β of 39.9° from perpendicular to the direction of propagation in optically-nonlinear crystal 50. Fundamental radiation is incident on face 50A at an angle γ of 56.1° which is Brewster's angle for the fundamental wavelength. In the resonator exemplified above with reference to FIG. 3, entrance face 50A of optically-nonlinear crystal 50 is axially spaced at about 55 mm from fold-mirror 26.

Figure 5:
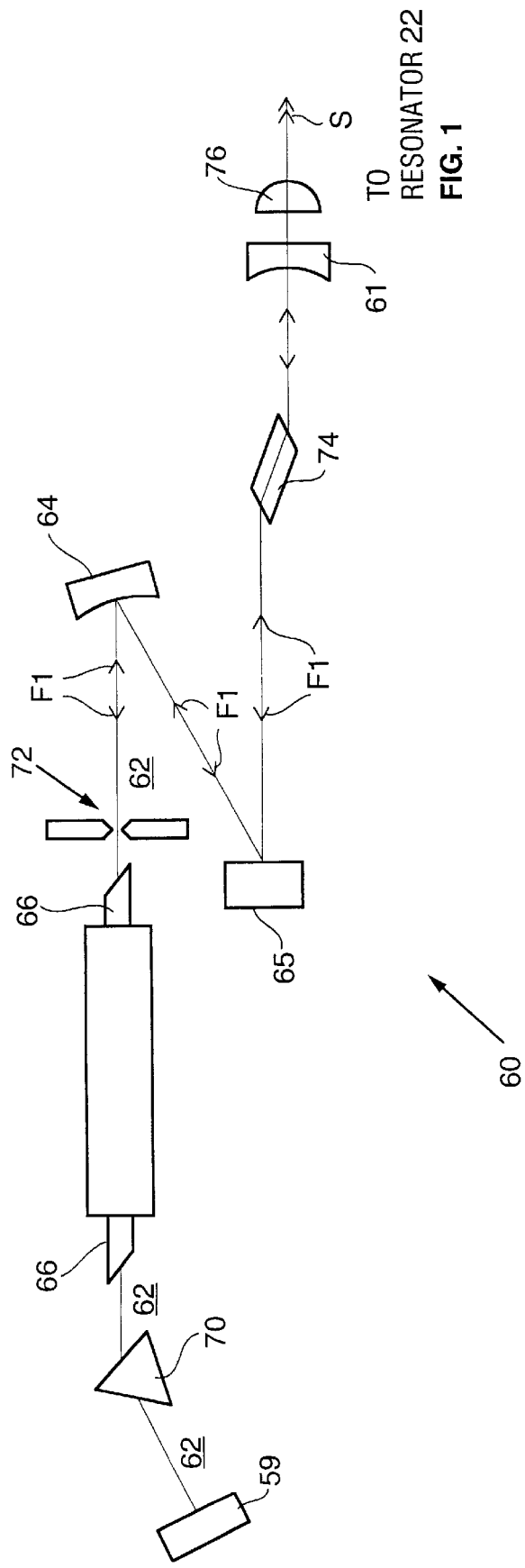
FIG. 5 schematically illustrates a prior-art intracavity frequency-doubled argon-ion laser suitable for the second laser-resonator of FIG. 1.

Referring now to FIG. 5, one preferred laser 60 for providing UV-radiation S of 244 nm is a FRED™ laser available from Coherent Laser Group of Santa Clara, Calif. Laser 60 is an intracavity frequency-doubled argon-ion laser having a resonator 62 terminated by end mirrors 59 and 61, folded by a fold mirrors 64 and 65, and including an argon plasma-tube 66. Details of pumping arrangements for plasma-tube 66 are omitted for simplicity of description. A prism 70 is included for selecting between the 514.5 nm and 488.0 nm fundamental argon-ion wavelengths illustrated collectively here by arrows F1. A spatial filter 72 is provided for mode selection. Mirrors 64 and 61 concentrate fundamental radiation F1 in a temperature controlled β-barium borate (BBO) crystal, arranged for frequency doubling the fundamental radiation thereby generating frequency-doubled radiation S. S has a wavelength of 244 nm when the 488 nm fundamental wavelength is selected by prism 70. A cylindrical lens 76 is provided for correcting ellipticity of the frequency-doubled beam produced by the BBO crystal.

The above-specified exemplary OPS-laser resonator 22 is capable of generating an intracavity fundamental (976 nm) radiation (F) power of 500 W or greater for sum-frequency mixing. Numerical models indicate that mixing 1 Watt of 244 nm radiation with 500 W of 976 nm radiation in a CLBO crystal, cut and arranged in the resonator as defined above as described above, will yield sum-frequency radiation SF at a power of about 100 mW in single longitudinal (axial) mode and single transverse mode with a beam divergence of about 1.2 times the diffraction limit ($M^2$=1.2). The quantity $M^2$ is a numerical measure which represents a ratio of the divergence of the beam to the divergence of a diffraction-limited beam of the same size. A high quality beam may be regarded as a beam having an $M^2$ of about 2.0 or less. The high-beam quality available with the inventive laser system makes it useful for applications in which the laser output-radiation must be focused to a very small spot for high-resolution direct writing. The invention, however, is not limited to single mode operation, somewhat higher output power may be achieved in multimode operation at the expense of some reduction in beam quality.

Figure 6:
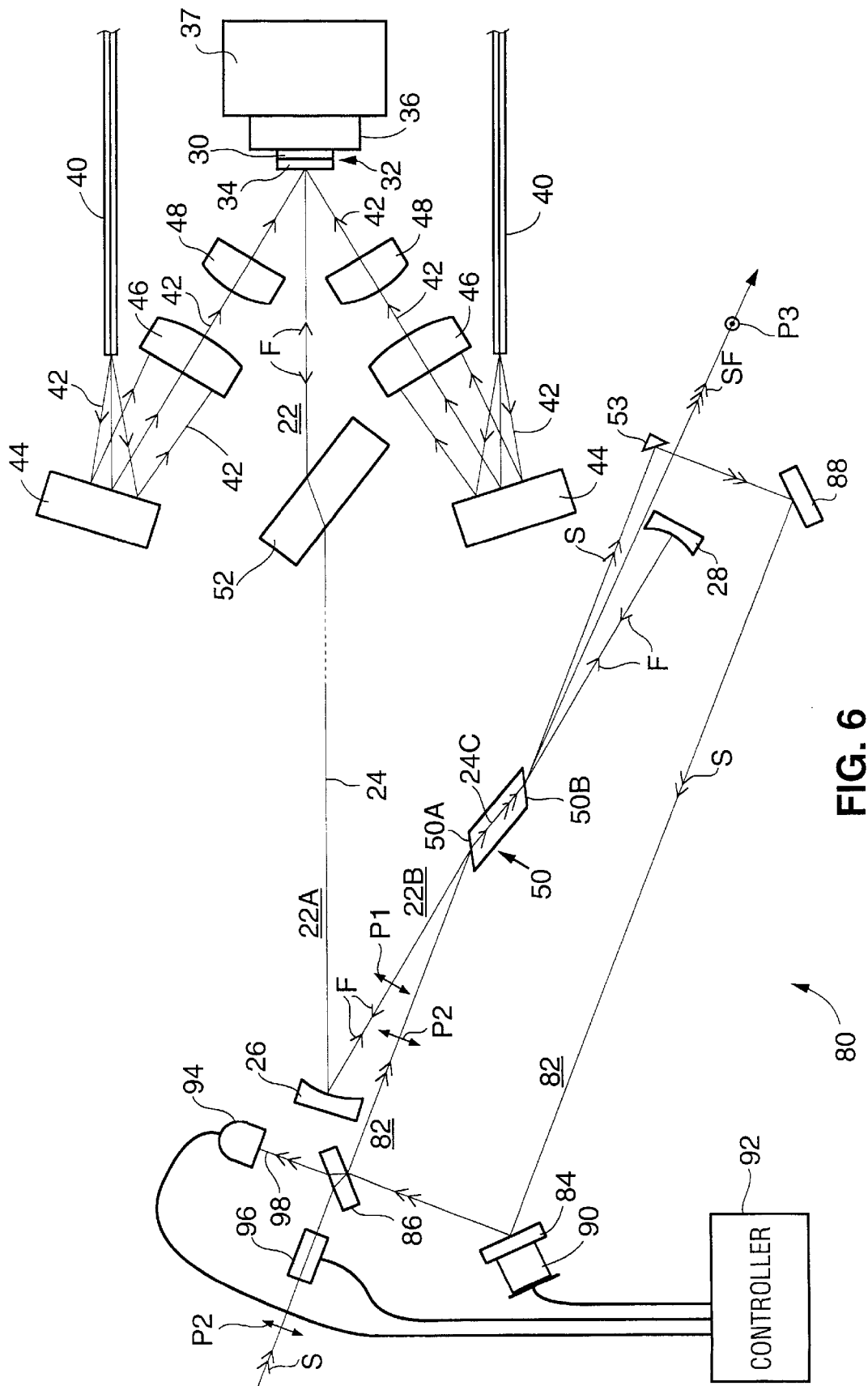
FIG. 6 schematically illustrates another preferred embodiment of a UV-laser system in accordance with the present invention similar to the laser system of FIG. 1 but further including a external ring-resonator for recirculating injected UV-radiation through the optically-nonlinear crystal.

Referring now to FIG. 6, another preferred embodiment 80 of a laser system in accordance with the present invention is illustrated. Laser system 80 includes resonator 22 of FIG. 1 including an optically-nonlinear crystal 50 arranged as described above. Laser 80 additionally includes a travelling-wave ring-resonator 82 formed by reflective stop 53 and mirrors 84, 86, and 88. Ring resonator 82 can be defined as a passive resonator inasmuch as it does not include a gain-medium for providing optical gain. Resonator 22 of FIG. 1 and resonator 62 of FIG. 5 can be defined as active resonators.

The purpose of ring-resonator 82 is to reinforce radiation S mixing with fundamental radiation F in optically-nonlinear crystal 50. Stop 53, and mirrors 84 and 86 are maximally reflective for radiation S. Mirror 86 is partially transmissive, for example, about 1% transmissive for radiation S. It is important in this embodiment of the present invention that radiation S is delivered from the external resonator in a single axial mode (single frequency).

Figure 8:
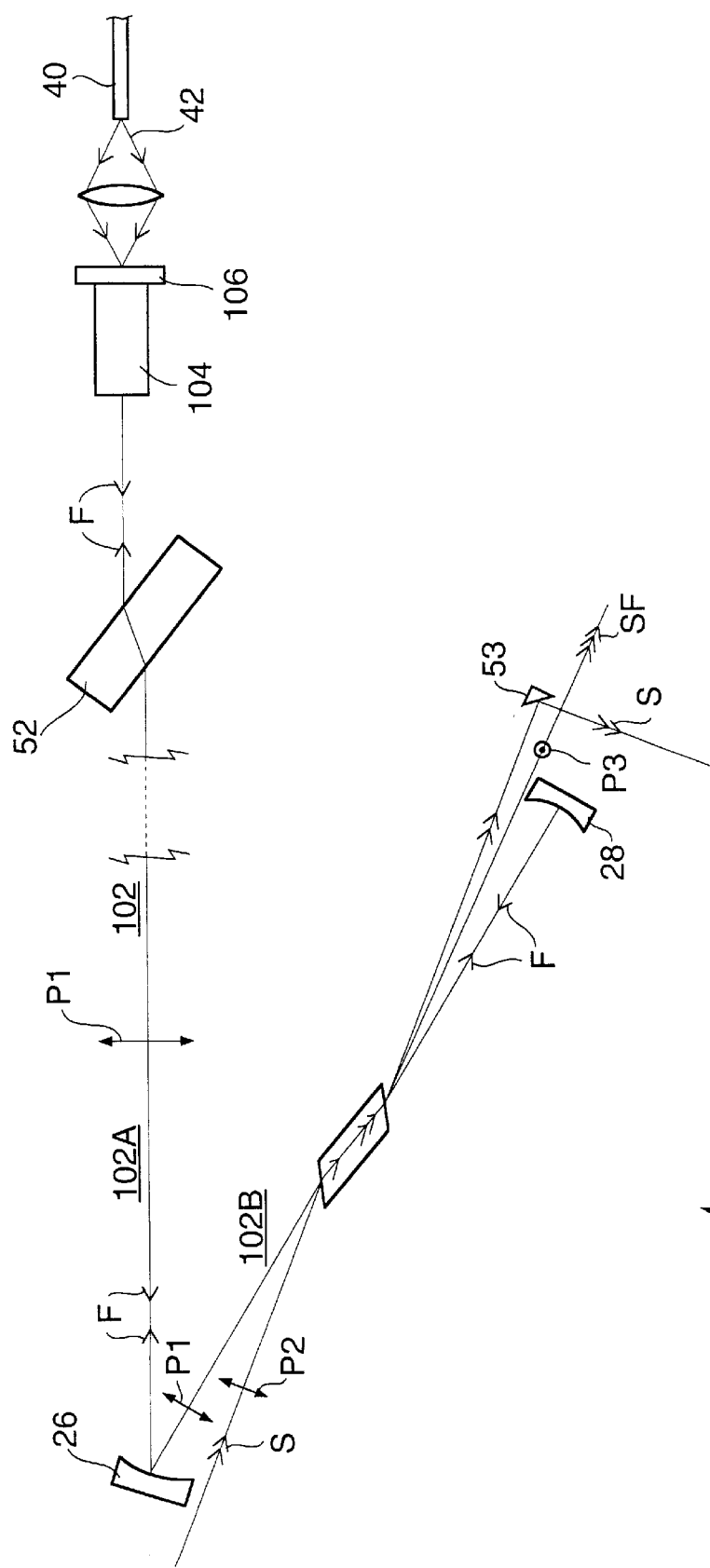
FIG. 8 schematically illustrates yet another preferred embodiment of a UV-laser system in accordance with the present invention having a first laser-resonator including solid-state gain medium and an optically-nonlinear crystal arranged for intracavity frequency-mixing the fundamental-wavelength of a solid-state gain-medium with UV-radiation injected into the first laser-resonator from a second laser-resonator.

Mirror 84 is driven by a piezoelectric driver 90 or the like to maintain ring-resonator 82 in a resonant condition for radiation S by actively adjusting the path length for radiation S in the ring-resonator. Operation of driver 90 is controlled by a electronic drive and control circuitry (controller) 92. A preferred control scheme for controlling piezoelectric driver 90 is a Pound-Drever locking scheme. This control scheme is described in detail in a paper "Laser Phase and Frequency Stabilization using an Optical Resonator", Applied Phys.B, Vol 31, pp97–105, 1983. A brief description of important elements of the control scheme is set forth below with continuing reference to FIG. 8.

A photodetector 94 is positioned to receive any radiation S reflected from mirror. When resonator 82 is in a resonant condition for radiation S, there is no radiation S reflected from mirror 86 along path 98. A phase-modulator 96 is positioned in the path of radiation S before it is injected into resonator 82 through mirror 86. The phase-modulator is arranged and operated at a predetermined frequency, for example, 20 megahertz (MHz), such that the spectrum of radiation leaving the phase-modulator includes a carrier component having the frequency of radiation S, and two side-band frequencies, one at a higher frequency and one at a lower frequency than the carrier-component frequency. The side-band frequencies have opposite phase.

When the carrier and side-band frequencies impinge on photodetector 94, the photodetector delivers a signal to controller 92. The signal delivered to controller 92 includes a 40 MHz component, created by beating of the side-band frequencies with each other, and two 20 MHz components having opposite phase, created by beating of the side-band frequencies with the carrier. Controller 92 is arranged to electronically filter the signal from photodetector 94 to remove the 40 MHz component therefrom. The sum of the remaining 20 MHz components provides an error signal for controlling driving of piezoelectric driver. The magnitude of the signal is representative of the difference in path-length for radiation S, in the resonator, from the path-length required for the resonant condition. The sign of the signal provides an indication of whether the path-length is too long or too short. The signal passes from negative to positive, steeply, through zero, which is the value of the signal when resonator 82 is in the resonant condition.

When optimally adjusted to resonance by piezoelectric driver 90, resonator 82 causes 1 W of radiation S injected therein via mirror 88 to build up in resonator 82 to about 8.0 W. This can increase the output-power of SF radiation to about 800 mW, given the above-discussed 500 W of circulating 976 nm radiation an 1 W of 244 nm radiation injected into resonator 82.

Figure 7:
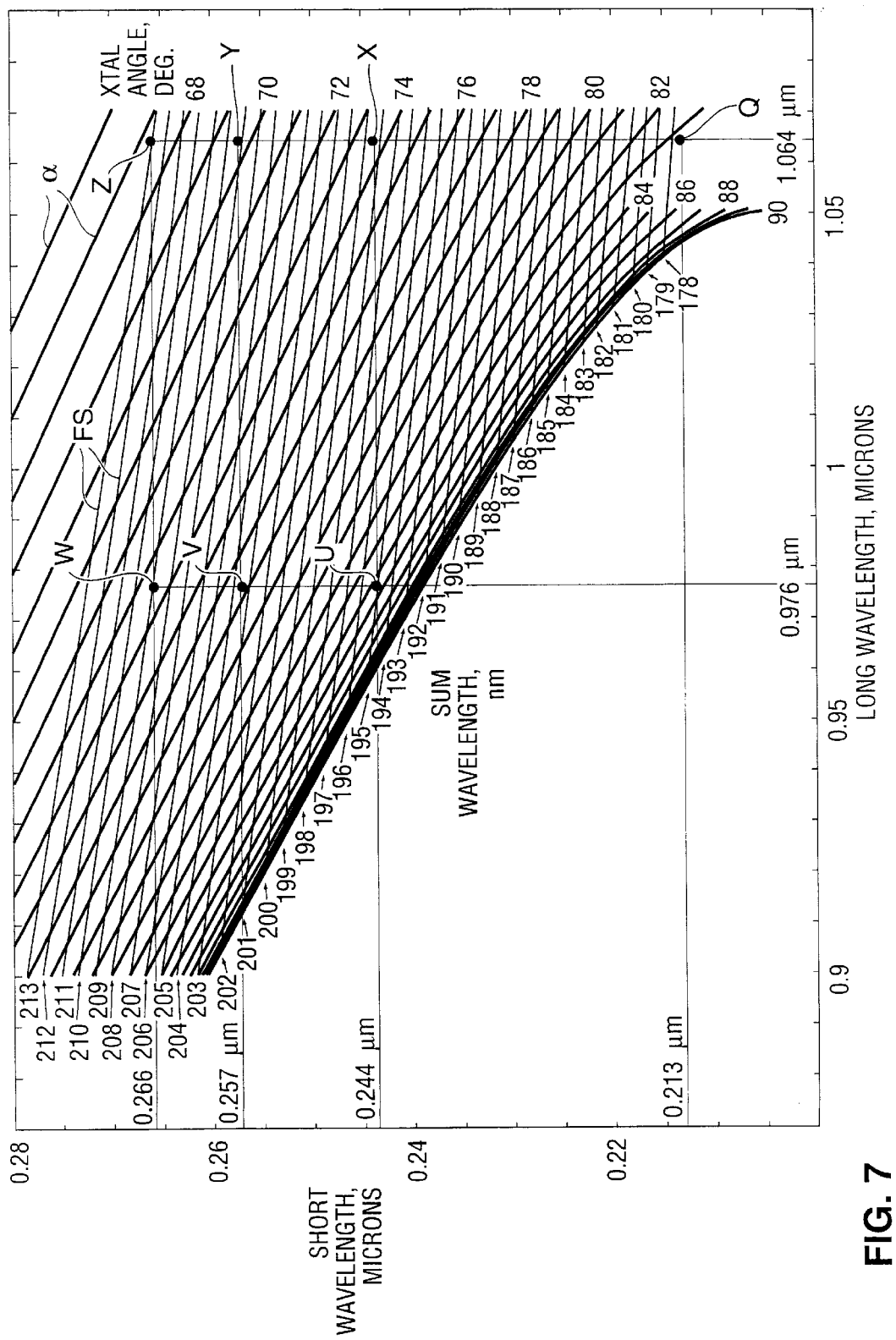
FIG. 7 is a nomogram schematically illustrating wavelength ranges of sum-frequency mixing and corresponding crystal angles in CLBO.

While laser systems in accordance with the present invention have been described with reference to generating 195 nm radiation by sum-frequency mixing 976 and 244 nm radiation, the inventive lasers are not limited to mixing those particular wavelengths or to mixing wavelengths which are harmonically related. By way of example, FIG. 7 illustrates a range of wavelengths F and S which may be mixed in a CLBO crystal in the above described laser systems to produce UV (SF) radiation in a wavelength range between about 175 nm and 215 nm. Radiation S may be derived not only from the frequency-doubled argon-ion laser exemplified above, but also from other laser types, such as well known frequency-quadrupled or frequency-quintupled Nd:YAG lasers. Similarly, fundamental radiation F may be produced not only from an above exemplified fundamental OPS-laser-resonator but from a suitably configured resonator including a solid-state gain medium such as Nd:YAG or Nd:YVO$_4$.

In FIG. 7, shallow-sloped lines FS indicate the loci of sum-frequency wavelengths on a Cartesian coordinate system with radiation S as the ordinate and radiation F as the abscissa. Steeper sloped lines α are the loci of crystal-cut angles (α in FIG. 4A ) for combinations of S, F and SF radiations. By way of example, point U at F=976 and S=244 lies on the 195 nm FS locus and between the 82° and 84° α loci, corresponding to the example described above. It can also be seen that 195 nm radiation can be provided by combinations of radiation S at a wavelength between about 239 nm and 245 nm with fundamental radiation F between 959 and 1070 nm at a corresponding crystal-cut angle between 74° and 90°.

Points V and W provide 203 and 208 nm radiation by mixing wavelengths S of respectively 257 nm (the second harmonic of argon 514.5 nm) and 266 (the fourth harmonic of Nd:YAG 1064 nm) with the 976 nm radiation of the above-described OPS-laser-resonator 22. Points X, Y and Z illustrate the sum-frequency wavelengths and corresponding crystal-cut angles for mixing fundamental 1064 nm Nd:YAG radiation with respectively the 244 nm, 257 nm and 266 nm wavelengths. Point Q indicates that 178 nm radiation can be generated by mixing the fifth harmonic of 1064 nm Nd:YAG (213 nm) with the fundamental 1064 nm radiation at a crystal-cut angle of about 85 degrees.

While embodiments of UV-laser systems in accordance with the present invention have been described with reference to using at OPS-laser for generating the longer wavelength radiation, this should not be construed as limiting the present invention. As discussed above with reference to FIG. 7, fundamental radiation may be generated in other laser types, for example, diode-pumped solid-state (DPSS) lasers. By way of example, in FIG. 8, an embodiment 100 of a laser system in accordance with the present invention is illustrated, wherein a DPSS-laser resonator 102 provides long-wavelength fundamental radiation. Laser 100 is similar in most regards to laser 20 of FIG. 1 with the exception of the fundamental resonator.

Resonator 102 includes a solid-state gain-medium 104. Gain-medium 104 is preferably Nd:YAG or Nd:YVO$_4$. The preference of these gain-media, however, should not be construed as limiting the present invention. One end-mirror 106 of resonator 102 is located very close to gain-medium 104, and may even be provided by an optical-coating deposited directly on a face of the gain-medium. However provided, mirror 106 is highly reflective for the lasing wavelength of the gain-medium and highly transmissive for the wavelength of pump-light 42. Pump-light 42 is delivered by an optical fiber 40 and focused by a lens 108, through mirror 106, into gain-medium 104.

In one example of laser 100, mirror 26 has a radius of curvature of 188 mm and is located 537 mm from mirror 106. Mirror 28 has a radius of curvature of 90 mm and is located 215 mm from mirror 26. Optically-nonlinear crystal 50 is located with face 50A thereof at a distance of 115 mm from mirror 26. Gain-medium 104 is a Nd:YVO$_4$ crystal having a length of 7.0 mm and a cross-section of 4.0 mm×4.0 mm. Pumping gain-medium with 20 W of 809 nm radiation can provide 200 W of 1064 nm radiation circulating in resonator 102.

Figure 2:
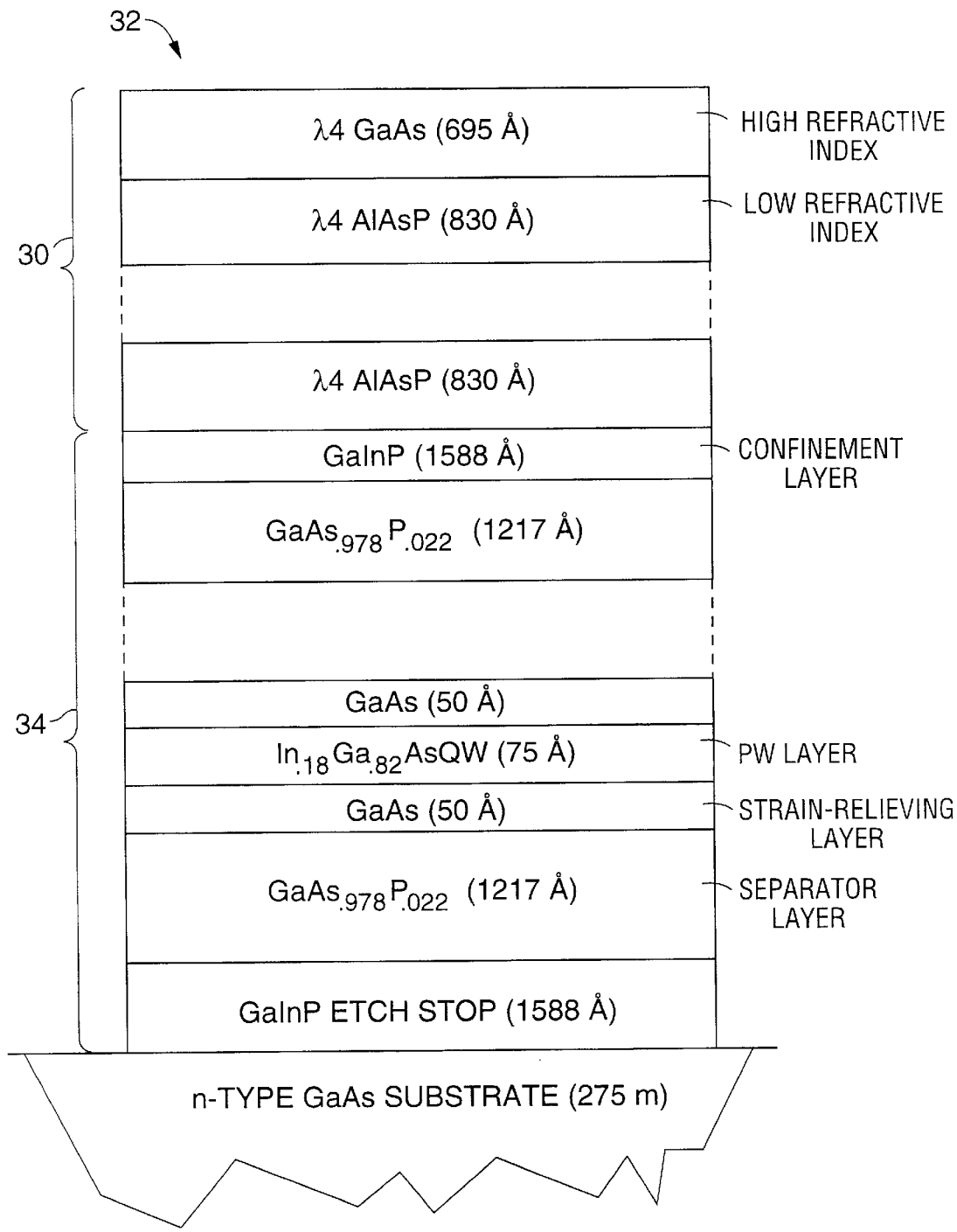
FIG. 2 schematically illustrates details of one preferred example of the OPS-structure of FIG. 1 for providing fundamental radiation at about 976 nm.

While an Nd:YAG or Nd:YVO$_4$ DPSS-laser resonator such as resonator 102 of laser 100 can generate circulating fundamental-radiation power comparable to that generated by resonator 22 of FIG. 1, is effectively limited (in the context of providing useful power) to generating a few discrete fundamental wavelengths at wavelengths of about 1052 nm or longer. One advantage, of using and OPS-laser for generating fundamental radiation in a laser system in accordance with the present invention is that a gain-structure of an OPS structure may be arranged (by appropriate selection of active layer composition) to provide fundamental radiation at a wide range of wavelengths within the preferred range of about 900 to 1080 nm corresponding to the CLBO arrangements of FIG. 7. The OPS-structure of FIG. 2 is one example of such a gain-structure and is an example of a general structure grown on a GaAs substrate and having active layers of a general composition In$_x$Ga$_{1-x}$As and separator layers of a general composition GaAs$_y$P$_{1-y}$, where 0.0<x<1.0, and 0.0<y<1.0. In this general structure, x may be selected to provide emission at essentially any wavelength between about 900 and 1050 nm, and y is selected to optimally absorb pump-light of an appropriate wavelength.

The present invention is described above in terms of a preferred and other embodiments. The present invention is not limited, however, to the embodiments described and depicted. Rather, the present invention is limited only by the claims appended hereto.

What is claimed is:

1. A laser system, comprising:

first and second active laser-resonators, said first active laser-resonator delivering laser-radiation at a first wavelength, and said second-active laser-resonator arranged to generate and oscillate fundamental laser-radiation therein having a second wavelength, said second laser-resonator including an optically-nonlinear crystal of CLBO;

said first and second laser-resonators and said optically-nonlinear crystal cooperatively arranged such that first-wavelength radiation delivered by said first laser-resonator enters said optically-nonlinear crystal without passing through any other component of said second laser-resonator at an angle to said second wavelength radiation and follows a common path with said second-wavelength radiation through said optically-nonlinear crystal, whereby said first-wavelength radiation is mixed in said optically-nonlinear crystal with said second-wavelength radiation oscillating in said second laser-resonator, thereby generating radiation having a third wavelength corresponding to the sum frequency of said first and second wavelengths; and wherein said third-wavelength radiation is delivered from said optically nonlinear crystal as output radiation of the laser system without passing through any other component of said second laser-resonator.

2. The laser system of claim 1, wherein said first wavelength is between about 200 and 280 nanometers, said second wavelength is between about 900 and 1080 nm, and said third wavelength is between about 175 and 215 nm.

3. The laser system of claim 2, wherein said first wavelength is about 244 nm, said second wavelength is about 976 nm, and said third wavelength is about 195 nm.

4. The laser system of claim 2, wherein said second laser resonator is an OPS-laser resonator.

5. The laser system of claim 2, wherein said second laser resonator is a solid-state laser resonator.

6. A laser system, comprising:

first and second active laser-resonators, said first active laser-resonator delivering laser-radiation at a first wavelength, and said second-active laser-resonator arranged to generate and oscillate fundamental laser-radiation therein having a second wavelength, said second active laser-resonator having an optically-nonlinear crystal located therein said optically-nonlinear crystal in commonly located in a passive laser-resonator arranged to circulate first-wavelength laser radiation therein; and said first and second active laser-resonators, said passive laser-resonator, and said optically-nonlinear crystal cooperatively arranged such that first-wavelength radiation is delivered by said first laser-resonator into said passive laser-resonator and circulates therein, and such that said circulating first-wavelength radiation is mixed in said optically-nonlinear crystal with said second-wavelength radiation oscillating in said second laser-resonator, thereby generating radiation having a third wavelength corresponding to the sum frequency of said first and second wavelengths.

7. The laser system of claim 6, wherein said first wavelength is between about 200 and 280 nanometers, said second wavelength is between about 900 and 1080 nm, and said third wavelength is between about 175 and 215 nm.

8. The laser system of claim 7, wherein said first wavelength is about 244 nm, said second wavelength is about 976 nm, and said third wavelength is about 195 nm.

9. The laser system of claim 7, wherein said optically-nonlinear crystal is a CLBO crystal.

10. The laser system of claim 9 wherein said CLBO crystal is arranged such that said circulating first-wavelength radiation enters said optically-nonlinear crystal at an angle to said second wavelength radiation and follows a common path with said second-wavelength radiation through said optically-nonlinear crystal, and first-wavelength radiation and third-wavelength radiation exit said optically-nonlinear crystal at an angle to said second-wavelength radiation.

11. The laser system of claim 6, wherein said second laser resonator is an OPS-laser resonator.

12. A laser system, comprising:

first and second active laser-resonators, said first active laser-resonator delivering laser-radiation at a first wavelength between about 200 and 280 nanometers and said second-active laser-resonator being an OPS-laser resonator arranged to generate and oscillate fundamental laser-radiation therein having a second wavelength between about 900 and 1050 nm, said second resonator including a CLBO crystal;

said first and second laser-resonators and said optically-nonlinear crystal cooperatively arranged such that first-wavelength radiation delivered by said first laser-resonator enters said optically-nonlinear crystal without passing through any other component of said second laser-resonator at an angle to said second wavelength radiation and follows a common path with said second-wavelength radiation through said optically-nonlinear crystal, whereby said first-wavelength radiation is mixed in said CLBO crystal with said second-wavelength radiation oscillating in said second laser-resonator, thereby generating radiation having a third wavelength corresponding to the sum frequency of said first and second wavelengths and having a wavelength between about 175 and 215 nm; and wherein said third-wavelength radiation is delivered from said optically nonlinear crystal as output radiation of the laser system without passing through any other component of said second laser-resonator.

13. The laser system of claim 12, wherein said second-wavelength radiation and said third-wavelength radiation exit said optically-nonlinear crystal at an angle of about 1 degree to each other group.

14. The laser system of claim 13, wherein said first wavelength is about 244 nm, said second wavelength is about 976 nm, and said third wavelength is about 195 nm.

15. The laser system of claim 12, wherein said OPS-laser resonator includes an OPS gain-structure having active layers of a active layers of a composition $In_xGa_{1-x}As$ and separator layers of a composition $GaAs_yP_{1-y}$, where $0.0<x<1.0$, and $0.0<y<1.0$.

16. The laser system of claim 14, wherein said first laser resonator is a frequency-doubled argon-ion laser resonator.

17. A laser system comprising:

a laser resonator including at least two mirrors and a nonlinear crystal therebetween for generating laser radiation at a first wavelength; and a source of laser radiation of a second wavelength, said radiation being directed to enter the nonlinear crystal of the laser resonator in a manner such that second wavelength laser radiation interacts with the first wavelength laser radiation within the crystal to generate laser radiation of a third wavelength corresponding to the sum frequency of the first and second wavelengths, with the laser radiation of said third wavelength exiting the laser resonator without passing through any of said resonator mirrors.

18. The laser system of claim 17, wherein the laser radiation of said second wavelength enters the nonlinear crystal without passing through any of said resonator mirrors.

19. The laser system of claim 17, wherein said nonlinear crystal is arranged such that said second-wavelength radiation enters said nonlinear crystal at an angle to said first-wavelength radiation and follows a common path with said first wavelength radiation through said nonlinear crystal, and first wavelength radiation and third-wavelength radiation exiting said nonlinear crystal at an angle to said second wavelength radiation.

20. The laser system of claim 17, wherein said first wavelength radiation is between about 200 and 280 nanometers, said second wavelength radiation is between about 900 and 1080 nm, and said third wavelength radiation is between about 175 and 215 nm.

21. The laser system of claim 17, wherein said nonlinear crystal is a crystal of an optically nonlinear material selected from the group consisting of CLBO, SBB0, SBO, BZBO, and BBO.

22. The laser system of claim 17, wherein said nonlinear crystal is a CLBO crystal.

23. The laser system of claim 17, further including a passive ring-resonator arranged for circulating said second wavelength radiation through said nonlinear crystal.

* * * * *